United States Patent
De Boer et al.

(10) Patent No.: US 9,395,635 B2
(45) Date of Patent: Jul. 19, 2016

(54) POSITION DETERMINATION IN A LITHOGRAPHY SYSTEM USING A SUBSTRATE HAVING A PARTIALLY REFLECTIVE POSITION MARK

(75) Inventors: Guido De Boer, Leerdam (NL); Niels Vergeer, Rotterdam (NL)

(73) Assignee: MAPPER LITHOGRAPHY IP B.V., Delft (NL)

(*) Notice: Subject to any disclaimer, the term of this patent is extended or adjusted under 35 U.S.C. 154(b) by 436 days.

(21) Appl. No.: 13/453,986

(22) Filed: Apr. 23, 2012

(65) Prior Publication Data

US 2012/0267802 A1 Oct. 25, 2012

Related U.S. Application Data

(60) Provisional application No. 61/478,126, filed on Apr. 22, 2011, provisional application No. 61/491,862, filed on May 31, 2011.

(51) Int. Cl.
*G03F 9/00* (2006.01)

(52) U.S. Cl.
CPC ............ *G03F 9/7088* (2013.01); *G03F 9/7076* (2013.01)

(58) Field of Classification Search
CPC ........ G03F 9/00; G03F 9/7088; G03F 9/7076
See application file for complete search history.

(56) References Cited

U.S. PATENT DOCUMENTS

| | | |
|---|---|---|
| 3,935,497 A | 1/1976 | Cowles |
| 4,251,160 A | 2/1981 | Bouwhuis et al. |
| 4,631,416 A * | 12/1986 | Trutna, Jr. .................... 250/548 |
| 4,701,606 A | 10/1987 | Tanimoto et al. |
| 4,716,441 A | 12/1987 | Ogawa |
| 4,861,162 A | 8/1989 | Ina |
| 4,967,088 A | 10/1990 | Stengl et al. |

(Continued)

FOREIGN PATENT DOCUMENTS

| | | |
|---|---|---|
| CN | 1495540 | 5/2004 |
| CN | 1577080 | 2/2005 |

(Continued)

OTHER PUBLICATIONS

Reich, C et al. "3-D shape measurement of complex objects by combining photogrammetry and fringe projection", Optical Engineering, Jan. 2000, p. 224-231, vol. 39 No. 1.

(Continued)

*Primary Examiner* — Michael A Lyons
(74) *Attorney, Agent, or Firm* — Blakely Sokoloff Taylor & Zaffman LLP

(57) ABSTRACT

The invention relates to a substrate for use in a lithography system, said substrate being provided with an at least partially reflective position mark comprising an array of structures, the array extending along a longitudinal direction of the mark, characterized in that said structures are arranged for varying a reflection coefficient of the mark along the longitudinal direction, wherein said reflection coefficient is determined for a predetermined wavelength. In an embodiment a specular reflection coefficient varies along the substrate, wherein high order diffractions are substantially absorbed by the substrate. A position of a beam on a substrate can thus be determined based on the intensity of its reflection in the substrate. The invention further relates to a positioning device and lithography system for cooperation with the substrate, and a method of manufacture of the substrate.

16 Claims, 8 Drawing Sheets

(56) References Cited

U.S. PATENT DOCUMENTS

| | | | |
|---|---|---|---|
| 5,243,195 A | 9/1993 | Nishi | |
| 5,477,057 A | 12/1995 | Angeley et al. | |
| 5,557,411 A | 9/1996 | Houryu et al. | |
| 5,594,549 A * | 1/1997 | Mori et al. | 356/401 |
| 5,644,137 A | 7/1997 | Waggener | |
| 5,706,091 A | 1/1998 | Shiraishi | |
| 5,721,605 A | 2/1998 | Mizutani | |
| 5,745,242 A | 4/1998 | Hata | |
| 5,783,833 A | 7/1998 | Sugaya et al. | |
| 5,827,629 A | 10/1998 | Miyatake | |
| 5,861,944 A | 1/1999 | Nishi | |
| 5,912,726 A | 6/1999 | Toguchi et al. | |
| 5,929,454 A | 7/1999 | Muraki et al. | |
| 5,943,135 A * | 8/1999 | Mishima | 356/401 |
| 6,266,130 B1 | 7/2001 | Hasegawa et al. | |
| 6,429,943 B1 * | 8/2002 | Opsal | G01B 11/02 356/625 |
| 6,459,473 B1 | 10/2002 | Chang et al. | |
| 6,469,793 B1 | 10/2002 | Stanton | |
| 6,522,411 B1 | 2/2003 | Moon et al. | |
| 6,525,802 B1 | 2/2003 | Novak | |
| 6,563,573 B1 | 5/2003 | Morohoshi et al. | |
| 6,583,430 B1 | 6/2003 | Muraki | |
| 6,674,510 B1 | 1/2004 | Jasper et al. | |
| 6,864,493 B2 | 3/2005 | Sato et al. | |
| 7,116,626 B1 | 10/2006 | Woods et al. | |
| 7,177,457 B2 | 2/2007 | Adel et al. | |
| 7,474,410 B2 * | 1/2009 | Moon | B82Y 10/00 356/501 |
| 2002/0020820 A1 | 2/2002 | Muraki | |
| 2002/0043163 A1 | 4/2002 | Novak | |
| 2003/0020184 A1 | 1/2003 | Ballarin | |
| 2004/0059540 A1 | 3/2004 | Matsumoto et al. | |
| 2004/0066518 A1 | 4/2004 | Kreuzer | |
| 2004/0130690 A1 | 7/2004 | Koren et al. | |
| 2004/0156026 A1 | 8/2004 | Kamiya | |
| 2004/0165195 A1 | 8/2004 | Sato | |
| 2005/0002004 A1 | 1/2005 | Kolesnychenko et al. | |
| 2005/0029981 A1 | 2/2005 | del Puerto | |
| 2005/0031969 A1 | 2/2005 | Finders et al. | |
| 2005/0069790 A1 * | 3/2005 | Gruss et al. | 430/22 |
| 2006/0011869 A1 | 1/2006 | Tanaka | |
| 2006/0058972 A1 | 3/2006 | Kok et al. | |
| 2006/0103845 A1 | 5/2006 | Tanaka et al. | |
| 2006/0138359 A1 | 6/2006 | Maeda | |
| 2006/0139660 A1 | 6/2006 | Kwan | |
| 2006/0192931 A1 * | 8/2006 | Roberts | G03F 7/70283 355/55 |
| 2006/0279735 A1 | 12/2006 | Van Haren et al. | |
| 2007/0041015 A1 * | 2/2007 | Van Bilsen | 356/401 |
| 2007/0114678 A1 | 5/2007 | Van Haren et al. | |
| 2007/0132996 A1 | 6/2007 | Van Haren et al. | |
| 2007/0234786 A1 | 10/2007 | Moon | |
| 2007/0247640 A1 | 10/2007 | Magome | |
| 2007/0260419 A1 | 11/2007 | Hagiwara | |
| 2008/0018897 A1 * | 1/2008 | Littau | H01L 22/14 356/401 |
| 2008/0074629 A1 | 3/2008 | Groeneveld et al. | |
| 2008/0083881 A1 | 4/2008 | Gorrell et al. | |
| 2008/0084547 A1 | 4/2008 | Tokuday | |
| 2008/0123203 A1 | 5/2008 | Onuki et al. | |
| 2008/0151228 A1 | 6/2008 | Hugers | |
| 2008/0165368 A1 | 7/2008 | Matsumoto | |
| 2008/0240501 A1 | 10/2008 | Van der Wijst et al. | |
| 2008/0266560 A1 | 10/2008 | Kok | |
| 2008/0291413 A1 | 11/2008 | Steijaert et al. | |
| 2008/0316445 A1 | 12/2008 | Watson et al. | |
| 2009/0002663 A1 | 1/2009 | Freimann et al. | |
| 2009/0061331 A1 | 3/2009 | Nakano | |
| 2009/0115983 A1 | 5/2009 | Stavenga et al. | |
| 2009/0153861 A1 | 6/2009 | Musa et al. | |
| 2009/0176167 A1 | 7/2009 | Hulsebos et al. | |
| 2009/0195763 A1 | 8/2009 | Butler et al. | |
| 2009/0237637 A1 | 9/2009 | Warnaar et al. | |
| 2009/0290139 A1 | 11/2009 | Van der Sijs | |
| 2010/0091259 A1 | 4/2010 | Koizumi | |
| 2010/0245848 A1 | 9/2010 | Sakamoto | |
| 2011/0013171 A1 | 1/2011 | Mueller et al. | |
| 2011/0090476 A1 | 4/2011 | Van de Kerkhof | |
| 2011/0102753 A1 * | 5/2011 | Van De Kerkhof et al. | 355/27 |
| 2012/0026479 A1 | 2/2012 | Hembacher et al. | |
| 2012/0050709 A1 | 3/2012 | Van der Pasch et al. | |
| 2012/0242969 A1 | 9/2012 | Van der Pasch et al. | |
| 2012/0268725 A1 | 10/2012 | de Boer et al. | |
| 2014/0168625 A1 | 6/2014 | Ito | |
| 2015/0109598 A1 | 4/2015 | Vergeer | |

FOREIGN PATENT DOCUMENTS

| | | |
|---|---|---|
| CN | 101114135 | 1/2008 |
| CN | 101551593 | 10/2009 |
| EP | 0698826 A | 2/1996 |
| EP | 0999475 A2 | 5/2000 |
| EP | 1061561 | 12/2000 |
| EP | 1076264 A | 2/2001 |
| EP | 1091385 | 4/2001 |
| EP | 1111473 A | 6/2001 |
| EP | 1148390 | 10/2001 |
| EP | 1265271 | 12/2002 |
| EP | 1434103 | 6/2004 |
| EP | 1491966 | 12/2004 |
| EP | 1674937 | 6/2006 |
| EP | 1975981 | 10/2008 |
| JP | H0497513 | 3/1992 |
| JP | H06302498 | 10/1994 |
| JP | H07074082 | 3/1995 |
| JP | H07221166 | 8/1995 |
| JP | H0982626 | 3/1997 |
| JP | 2001358068 | 12/2001 |
| JP | 2002190438 | 7/2002 |
| JP | 2003037036 | 2/2003 |
| JP | 2005057222 A | 3/2005 |
| JP | 2006339647 | 12/2006 |
| JP | 2007142419 | 6/2007 |
| JP | 2008171960 | 7/2008 |
| JP | 2009277678 | 11/2009 |
| WO | 9839689 A | 9/1998 |
| WO | WO-03033199 A1 | 4/2003 |
| WO | 2005010618 A | 2/2005 |
| WO | WO-2006009188 | 1/2006 |
| WO | 2007032670 A | 3/2007 |
| WO | 2007038134 A | 4/2007 |
| WO | WO-2007077925 | 7/2007 |
| WO | WO-2008037496 | 3/2008 |
| WO | WO-2008126925 | 10/2008 |
| WO | WO-2010032224 | 3/2010 |
| WO | WO-2010087352 | 8/2010 |

OTHER PUBLICATIONS

Buydens, L et al. "Amplitude modulation and beam-steering properties of active binary phase gratings with reconfigurable absorption areas", Applied Optics, Jul. 20, 1994, p. 4792-4800, vol. 33, No. 21.

Lalanne, P et al. "Antireflection behavior of silicon subwavelength periodic structures for visible light", Nanotechnology, 1997, p. 53-56, vol. 8.

Robledo-Sanchez, C et al. "Binary grating with variable bar-space ratio following a geometrical progression", Optics Communications, 1995, p. 465-470, vol. 119.

Davis, J A et al. "Encoding amplitude and phase information onto a binary phase-only spatial light modulator", Applied Optics, Apr. 10, 2003, p. 2003-2008, vol. 42, No. 11.

Davis, J A et al. "Encoding amplitude information onto phase-only filters", Applied Optics, Aug. 10, 1999, p. 5004-5013, vol. 38, No. 23.

Takeda, M et al. "Fourier transform profilometry for the automatic measurement of 3-D object shapes", Applied Optics, Dec. 15, 1983, p. 3977-3982, vol. 22, No. 24.

Print of Internet publication "Improved Overlay for ASML Systems", downloaded on Sep. 1, 2007 from http://www.asml.com/asmldotcom/show.do?ctx=9976&rid=9991.

Collischon, M et al. "Optimized artificial index gratings", Infrared Physics & Technology, 1995, p. 915-921, vol. 36.

(56) References Cited

OTHER PUBLICATIONS

Leray, P et al. "Overlay Metrology for Double Patterning Processes", Proceedings of SPIE, vol. 7272 72720G-1, doi: 10.1117/12.814182.
Fuller, L. "Wafer alignment for Canon Stepper", downloaded from http://people.rit.edu/lffeee/align.pdf, 2008.
Tao, W et al. "Novel fast and accurate correlation-tracking algorithm", Oct. 8, 1996, translation by National Air Intelligence Center NAIC-ID(RS)T-0408-96.
Fuller, L., et al., "Introduction to ASML PAS 5500 Wafer Alignment and Exposure," Nov. 10, 2011, Rochester Institute of Technology Microelectronic Engineering, p. 1-47.
Durnin, J. "Exact Solutions for Nondiffracting Beams I. The Scalar Theory." J. Opt. Soc. Am. A. vol. 4, No. 4. Apr. 1987. pp. 651-654. 4 pages.
Ina. "Aberration Evaluation of Alignment Optics in Lithographic Tools by Use of a Step-Height Structure Highly sensitive to the Asynmmtetry of an Optical Image." Applied Optics, vol. 46, No. 17. pp. 3485-3492 (Jun. 10, 2007). 8 pages.
Non-Final Office Action in U.S. Appl. No. 13/470,234 dated Jun. 30, 2015. 14 pages.
Notice of Allowance in U.S. Appl. No. 13/453,989 dated Jul. 30, 2015. 17 pages.
Final Office Action dated Oct. 13, 2015, U.S. Appl. No. 13/453,994. 11 pages.
Japanese Office Action with English Language Translation, dated Mar. 1, 2016, Japanese Application No. 2014-506356.
Notice of Allowance in U.S. Appl. No. 13/470,234, mailed Mar. 1, 2016.

\* cited by examiner

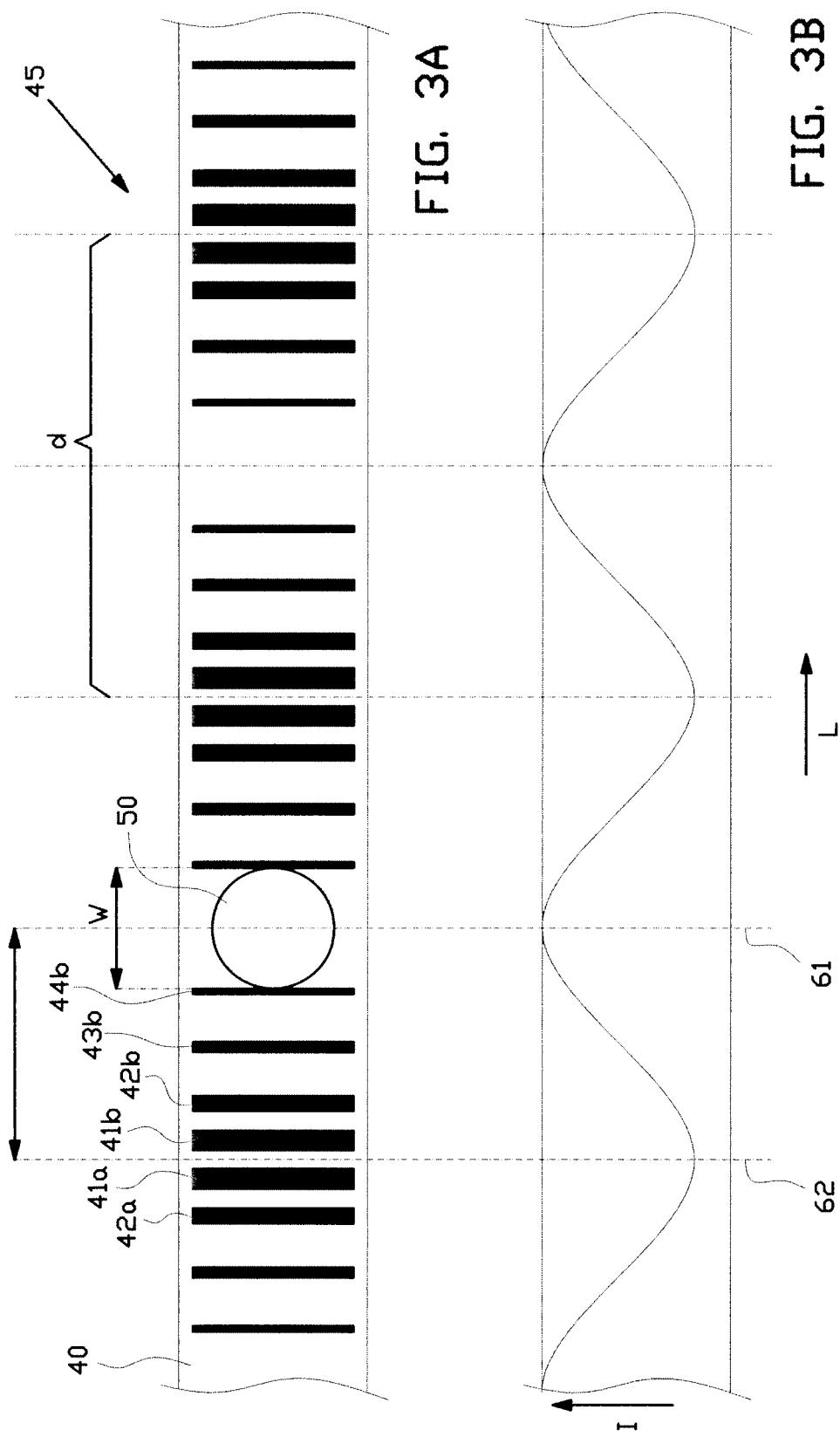

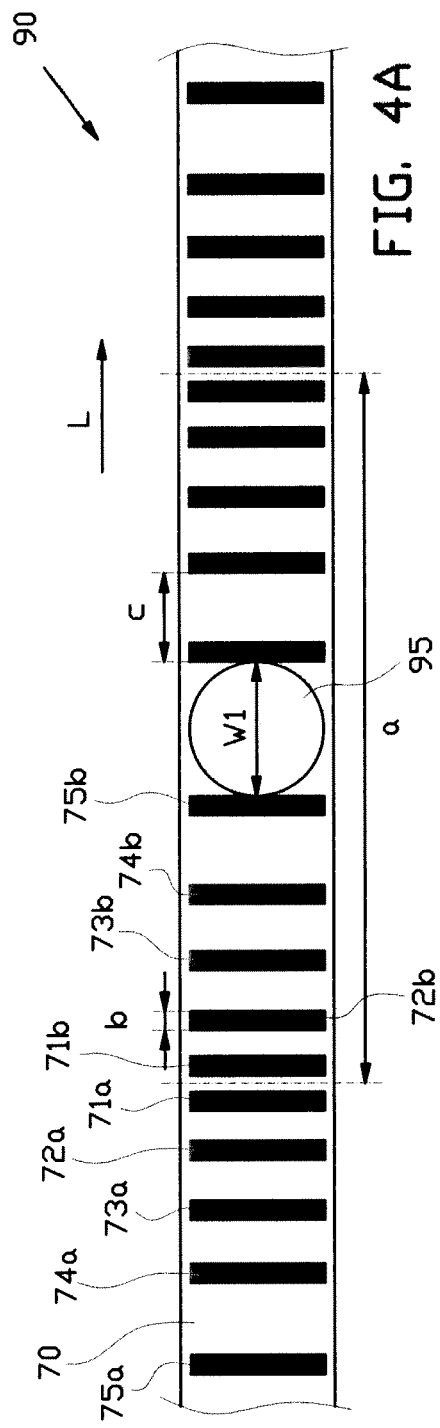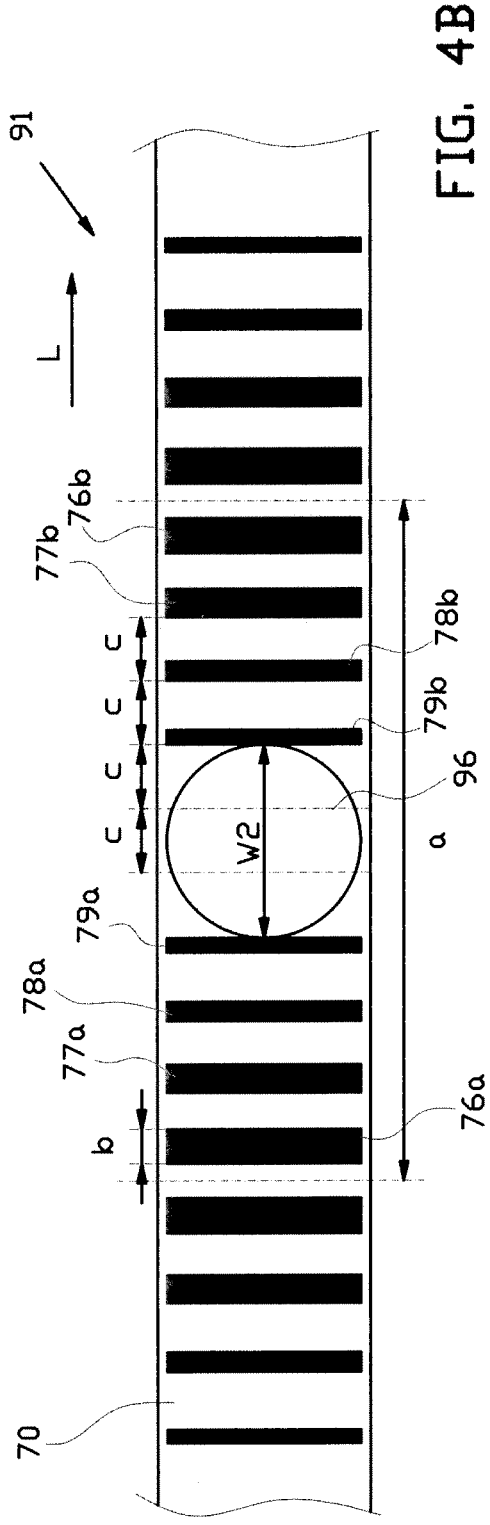

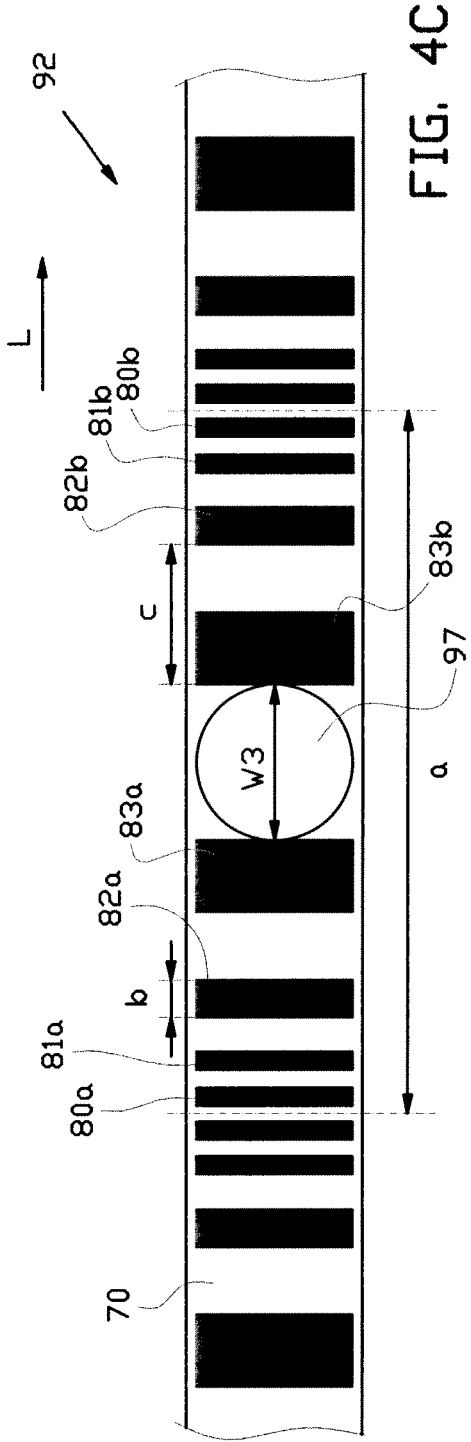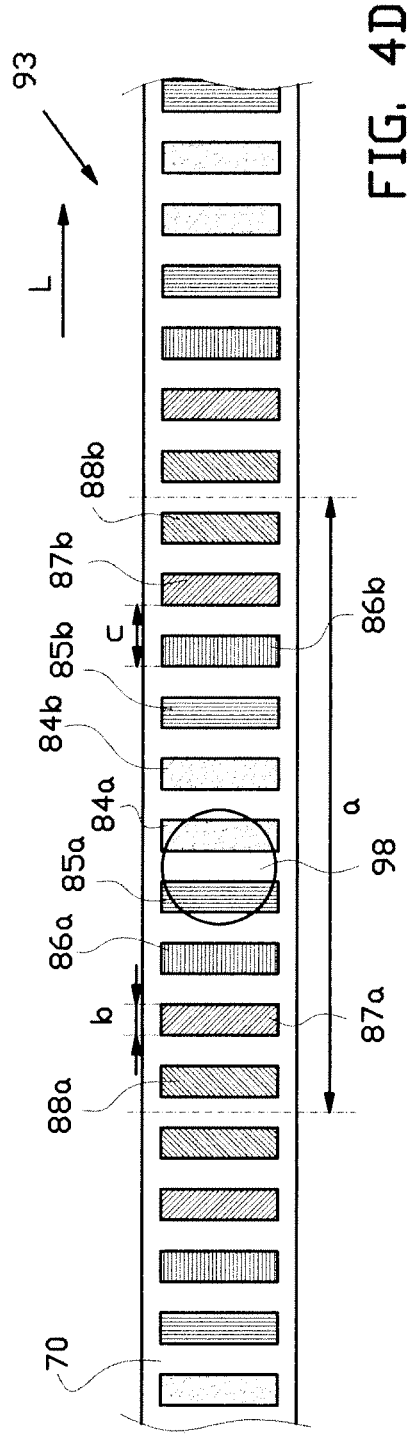

POSITION DETERMINATION IN A LITHOGRAPHY SYSTEM USING A SUBSTRATE HAVING A PARTIALLY REFLECTIVE POSITION MARK

This is a non-provisional application claiming the benefit of U.S. Provisional Application No. 61/478,126, filed Apr. 22, 2011, and U.S. Provisional Application No. 61/491,862, filed May 31, 2011.

BACKGROUND

The present invention relates to a substrate and method for position determination in a lithography system. In particular the invention relates to a substrate having provided thereon an at least partially reflective position mark comprising an array of structures, the array extending along a longitudinal direction of the mark, and a method for determining a position of such a substrate in a lithography system.

Position determination in lithography systems is generally known, normally using detection of light reflected in several diffraction orders, as is described for instance in U.S. Pat. No. 4,967,088. A disadvantage of determining a position using light reflected in several diffraction orders is that the light detectors for the different diffraction orders have to be accurately positioned in the system, thus increasing the cost of the system. Moreover, such systems are sensitive to slight errors in focus of the light beam or tilt of a substrate in relative to the light beam.

In order to at least partially overcome this problem, it has been suggested to provide a substrate comprising a checkerboard pattern of reflective squares, having a maximum reflection coefficient, and non-reflective squares, having a minimum reflection coefficient, wherein said squares have a width corresponding to a diameter of a cross-section of a light beam projected on said pattern. By measuring a reflected zero-th order intensity of the beam, a change in position of the beam relative to the substrate can be determined without measuring multiple diffraction orders. Ideally, when the beam spot of the light beam is moved over the pattern, the intensity of the reflected signal is a sinusoidal function with high contrast of the position of the beam spot on the pattern. However, in practice the intensity distribution of the beam spot generally does not correspond to a homogeneous and sharply cut-off disc-like profile but instead follows a Gaussian profile, the resulting reflected intensity signal does not closely resemble a sinusoid function as a function of the position of the beam on the substrate. As a result, the determination of the position of the beam spot on the substrate based on the intensity of the reflected beam is less accurate.

It is an object of the present invention to provide a substrate for use with a relatively simple positioning system for a target such as a wafer, which substrate allows more accurate position determination. It is a further object of the invention to provide such a substrate having a large contrast between an area of high reflectivity and an area of low reflectivity.

SUMMARY OF THE INVENTION

To this end, according to a first aspect, the present invention provides a substrate for use in a lithography system, said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength, wherein a pitch between a first structure of the array and a second structure of the array neighboring said first structure is different from a pitch between said second structure and a third structure of the array neighboring said second structure, and wherein pitch between neighboring structures along the longitudinal direction follows a sinusoid function of the position of said structures along the longitudinal direction. As the pitch between said structures varies according to a sinusoid function, the degree in which an intensity signal of a beam partially reflected by said substrate when the beam is moved over the substrate along the longitudinal direction follows a sinusoid function is substantially less dependent on the beam profile. As a result, the reflected intensity signal may follow a substantially sinusoid function when the beam has a Gaussian or other profile which differs from a sharply defined homogeneous disc-like profile. As an extreme example, if the beam-spot were square, the resulting intensity signal of a beam reflected in the substrate could still be substantially sinusoid.

Herein, a pitch between neighboring structures is defined as the distance between an outer edge of a structure to be covered by the beam spot, and a corresponding edge of the neighboring structure. For instance, when the structures, at least those parts of the structure intended to be illuminated by a beam, are substantially rectangular in shape, with a leftmost edge of each structure substantially perpendicular to the longitudinal direction, the pitch would be defined as the distance between the leftmost edge of a structure to the leftmost edge of a neighboring structure.

The amount of energy of a beam of said wavelength reflected by the position mark thus varies dependent on the position of a beam spot on the mark, such that a position of the beam spot on the position mark may be determined by simply measuring the intensity of the reflected beam.

In an embodiment the structures are arranged for varying a specular reflection coefficient of the mark along the longitudinal direction. A beam reflected beam in the position mark thus preferably comprises only the specular, or zeroth order reflection. Thus, the positioning system used for determining the intensity of the reflected can be kept simple and compact. Moreover, the position determination is not substantially affected by small variations in alignment between the beam spot on the position mark and a beam intensity detector for measuring the intensity of the reflected beam. The substrate according this embodiment allows standard off the shelf DVD- or CD-heads and the like to be used for determining the intensity of a specularly reflected beam, and thus for determining a position of the beam spot in the position mark on the substrate. In a preferred embodiment the structures are arranged substantially absorbing higher order diffractions by multiple reflection of said higher order diffractions within the mark. The multiple reflection may comprise both specular and diffuse reflection.

In an embodiment the structures each have a width along the longitudinal direction, said width being less than said predetermined wavelength, wherein a distance between neighboring structures along the longitudinal direction is less than said predetermined wavelength. In this embodiment the structures used are sub-wavelength structures which affect the reflection coefficient of an area on the position mark yet which may not be individually resolved using a beam of the predetermined wavelength. Using such sub-wavelength structures a very gradual variation in reflection coefficient may be achieved in the position mark along the longitudinal direction.

In an embodiment the structures are aligned on points which are equidistantly spaced along the longitudinal direction. For instance, the structures may be aligned with their left most edge on such an equidistant point. At least some of these equidistantly spaced points may be free of a corresponding structure. Thus a substrate may be provided having a number of consecutive structures at a pitch c which pitch c is equal to the distance between the equidistanced points, and wherein a further structure is at a different pitch from its neighboring structure which is an integer multiple of said pitch c. This embodiment allows further variation in position of the structures. Preferably, the substrate is adapted to be used with a light beam projected onto said substrate, said light beam having a cross-sectional diameter which is larger that a distance between two neighboring of said equidistant points.

In an embodiment a first structure of said structures has a different width along the longitudinal direction than a second structure of said structures, allowing further variation of the reflection coefficient of the mark along the longitudinal direction.

In an alternative embodiment the structures have substantially identical dimensions, allowing easy fabrication. In this embodiment the structures preferably have rectangular shapes which are easily produced on a substrate with high accuracy.

In an embodiment the distance between neighboring structures along the longitudinal direction of the mark is substantially equal to a width of a structure. In this embodiment a substantially sinusoidal reflected beam intensity signal is obtained when a disc-shaped beam spot having a diameter equal to the width of the structures is moved across the position mark.

In an embodiment a maximum distance between neighboring structures along the longitudinal direction is at most 610 nm, preferably within a range of 590 nm to 610 nm, preferably substantially equal to 600 nm. Such a substrate is particularly well suited to be used in combination with an off-the shelf CD- or DVD head, capable of projecting a light beam with a spot diameter of 590 nm to 610 nm, preferably 600 nm onto the substrate.

In an embodiment the substrate is adapted for cooperation with a positioning system which is adapted for emitting a light beam onto the substrate for generating a beam spot on said substrate, wherein the light beam has a wavelength equal to the predetermined wavelength, wherein a maximum distance between neighboring structures along the longitudinal direction is at most equal to the diameter of the beam spot. By spacing the structures no father apart than the diameter of the beam spot, any movement of the beam spot on the position mark may result in a change in absorption of part of the beam by a structure. Moreover, when the beam is positioned exactly between two structures which are spaced apart a distance equal to the diameter of the beam, the area of the mark between these structures provides a maximum reflection coefficient.

In an embodiment the structures form a periodic pattern of structures repeating along said longitudinal direction, wherein the period of said pattern is larger than said diameter of the beam spot, preferably at least twice as large. Preferably the periodic pattern of structures has a periodicity of 2 micron or less, and preferably the beam spot has a diameter of approximately 600 nm.

In an embodiment the pitch between neighboring structures is less than or equal to the diameter of the beam spot, ensuring that a beam spot on the position mark always at least partially covers one of said structures.

In an embodiment the structures are dimensioned and arranged for varying the reflection coefficient as a sinusoidal function of the position of beam spot on the position mark along the longitudinal direction. A coarse alignment or position of the beam spot on the position mark may thus be determined by counting maxima in a reflected beam intensity, and a more fine-grained alignment or position may be determined by comparing the reflected beam intensity signal with a maxima and minima of the reflected beam intensity signal measured thus far.

In an alternative embodiment the mark has a varying reflection coefficient which is monotonically increasing along substantially the entire length of the mark in the longitudinal direction, preferably strictly increasing, allowing absolute alignment or position determination of a beam spot on a substrate.

In an embodiment the substrate is formed as an integrated unit from a single material, preferably silicon. The substrate preferably comprises a wafer, wherein the position mark is preferably provided on one or more scribe-lines of said wafer. The position and/or alignment of a beam spot on the wafer can thus be determined. In an embodiment the substrate is provided on an edge of a target carrier, for determining the position and/or alignment of a beam spot on the target carrier.

In an alternative embodiment a first of said structures comprises a first material and a second of said structures comprises a second material having a different reflection coefficient than said first material. For example, the position mark may comprise a silicon surface on which a first structure is provided in the form of a sub-wavelength silicon structure, and wherein other structures are provided comprising different material such as aluminum, copper, and/or silicondioxide, the other structures having a dimension along the longitudinal direction which is greater than the wavelength. This embodiment thus provides a further class of substrates provided with structures which vary a reflection coefficient along the mark.

In an embodiment a maximum reflection coefficient of an area of the position mark for said wavelength is substantially equal to 1. The reflected intensity signal may thus vary between the minimum reflection coefficient of an area of the position mark, which is typically substantially equal to 0, and the maximum reflection coefficient, such the need to further amplify the reflected signal to obtain a measurable signal is reduced.

In an embodiment a specular reflection coefficient varies along the substrate, wherein high order diffractions are substantially absorbed by the substrate. A position of a beam on a substrate can thus be determined based on the intensity of its reflection in the substrate.

According to a second aspect the present invention provides a position device arranged for determining a position of a beam on a position mark of a substrate described herein, said position device comprising a beam source arranged for providing a light beam of said predetermined wavelength, a beam intensity detector arranged for determining an intensity of a reflected light beam, wherein the reflected light beam is generated by reflection of the light beam on said position mark, an optical system arranged for focusing the light beam on the position mark and for guiding the reflected light beam on the beam intensity detector, wherein said beam intensity detector is arranged for detecting a light beam intensity for the zeroth order reflection of the reflected light beam and adapted for providing a signal representative of the reflected beam intensity. The beam detector preferably comprises a single photodiode. As the position is determined is based on the intensity of the zeroth order reflection of the beam, no separate beam detector units are needed for detecting different orders. Preferably only the zeroth order reflection is guided onto the beam intensity detector. However, in an embodiment one or more higher order reflections, specifically the first order reflection, may be guided onto the same beam intensity detector as well, wherein the beam intensity detector is adapted for detecting an intensity of the combined reflections at the detector. In both embodiments construction of the position device remains simple, as only one beam intensity detector is necessary for to detect a reflection intensity of single beam projected onto the substrate.

According to a third aspect the present invention provides a lithography system for processing a target, said system comprising a substrate as described herein, said system comprising an alignment beam source arranged for providing an alignment beam of said predetermined wavelength, an alignment beam intensity detector arranged for determining an intensity of a reflected alignment beam, wherein said reflected alignment beam is generated by reflection of the beam on said position mark, an optical system arranged for focusing the alignment beam on the position mark and for guiding the reflected alignment beam on the alignment beam intensity detector, wherein said alignment beam intensity detector is arranged for detecting an alignment beam intensity of the zeroth order reflection of the reflected alignment beam. The lithography system according to the invention is thus provided with means for determining the alignment and/or position of a substrate relative to a beam spot of the alignment beam. Typically the substrate is moveable with respect to the alignment beam, in particular with respect to the beam spot thereof.

In an embodiment the lithography system further comprises a target carrier, adapted for moving the target relative to the optical system along the longitudinal direction, wherein said substrate is provided on the target carrier and/or on the target, a processing unit adapted for determining a alignment and/or position of the substrate relative to the optical system based on the detected intensity of the reflected alignment beam. The lithography system according to the invention is thus provided with means for determining an alignment and/or position of the target within the system. The optical system is preferably fixedly attached to the lithography system to facilitate position determination of the target relative to the optical system.

In an embodiment the lithography system further comprises an optical column adapted for projecting one or more exposure beams on the target, wherein the optical system is attached to the optical column. The optical system is preferably attached close to a distal end of the optical column, in particular close to the target end of the optical column. Alignment and/or position determination of an area of the target to be exposed may thus be carried out close to the target and/or the substrate.

In an embodiment the optical column is adapted for projecting a multitude of charged particle exposure beams onto the target, and wherein said optical system is mounted on or near a downstream portion of the optical column, preferably within a distance of 100 micron to an outer exposure beam thereof.

In an embodiment the optical system is, at least during use, arranged at a distance of 2 mm or less from the substrate, providing a very compact system for position determination.

In an embodiment the optical system is arranged for projecting said alignment beam onto the substrate substantially perpendicular on said substrate. As the specular reflection will be excident substantially perpendicular to the substrate and back into the optical system, a compact system for position determination is provided.

According to a fourth aspect the present invention provides a method for manufacturing an alignment and/or positioning mark on a substantially reflective substrate to be illuminated by a beam, comprising a step of providing structures on the substrate, each structure arranged within a distance of a beam wavelength from a neighboring structure, said structures adapted to substantially absorb the energy of said incident beam. Part of the mark covered by the structures thus substantially absorbs an incident beam, whereas part of the mark not covered with structures substantially specularly reflects an incident beam, thus providing a substrate having reflection coefficient which varies along its surface.

In an embodiment said structures are provided on the substrate at different distances and/or pitches from each other.

In an embodiment said structures form a pattern with a period greater than a diameter of a beam spot of said beam.

According to a fifth aspect the present invention provides a method for alignment and/or position determination of a beam spot on a substrate as described herein, said method comprising the steps of illuminating the substrate with a light beam, detecting an intensity of a specular reflection of said light beam, determining, based on said detected intensity, a position and/or alignment of substrate relative to the beam spot. The method thus provides a simple yet accurate way to determine the position and/or alignment of a substrate relative to a beam spot or optical system emitting the beam spot.

In an embodiment the method further comprises a step of measuring a position of the substrate using a further measurement system, wherein the position and/or alignment of the substrate is further determined based on the measurement by the further measurement system. The further measurement system for instance comprises an interferometer and/or feedback loop for actuators for moving the substrate relative to the light beam. Preferably, alignment of the beam spot is initially performed based on the measured intensity of the beam reflected by the substrate, after which further position determination during processing of a target is based on the measurements by the further measurement system.

According to a sixth aspect, the present invention provides a substrate for use in a lithography system, said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength. The amount of energy of a beam of said wavelength reflected by the position mark thus varies dependent on the position of a beam spot on the mark, such that a position of the beam spot on the position mark may be determined by simply measuring the intensity of the reflected beam.

In an embodiment a pitch between a first structure of the array and a second structure of the array neighboring said first structure is different from a pitch between said second structure and a third structure of the array neighboring said second structure. By varying the pitch between structures along the longitudinal direction a substantially greater variation in reflection coefficient may be achieved than when the pitch is fixed as is for instance the case when position measurement is based on measured beam intensities of several diffraction orders.

In an embodiment the pitch between neighboring structures along the longitudinal direction follows a sinusoid function of the position of said structures along the longitudinal direction. The structures are thus arranged for smoothly varying the reflection coefficient of the position mark along the longitudinal direction.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 3A shows a substrate according to the invention, provided with rectangular beam absorbing structures, FIG. 3B shows a reflected intensity signal of a beam moving along the longitudinal direction over the substrate of FIG. 3A, FIGS. 4A, 4B, 4C and 4D show embodiments of a substrate according to the present invention, FIG. 5 schematically shows a position device adapted for providing a beam for cooperation with a substrate according to the invention, and for detecting an intensity of a reflection of said beam in said substrate.

DETAILED DESCRIPTION OF THE INVENTION

Figure 1:
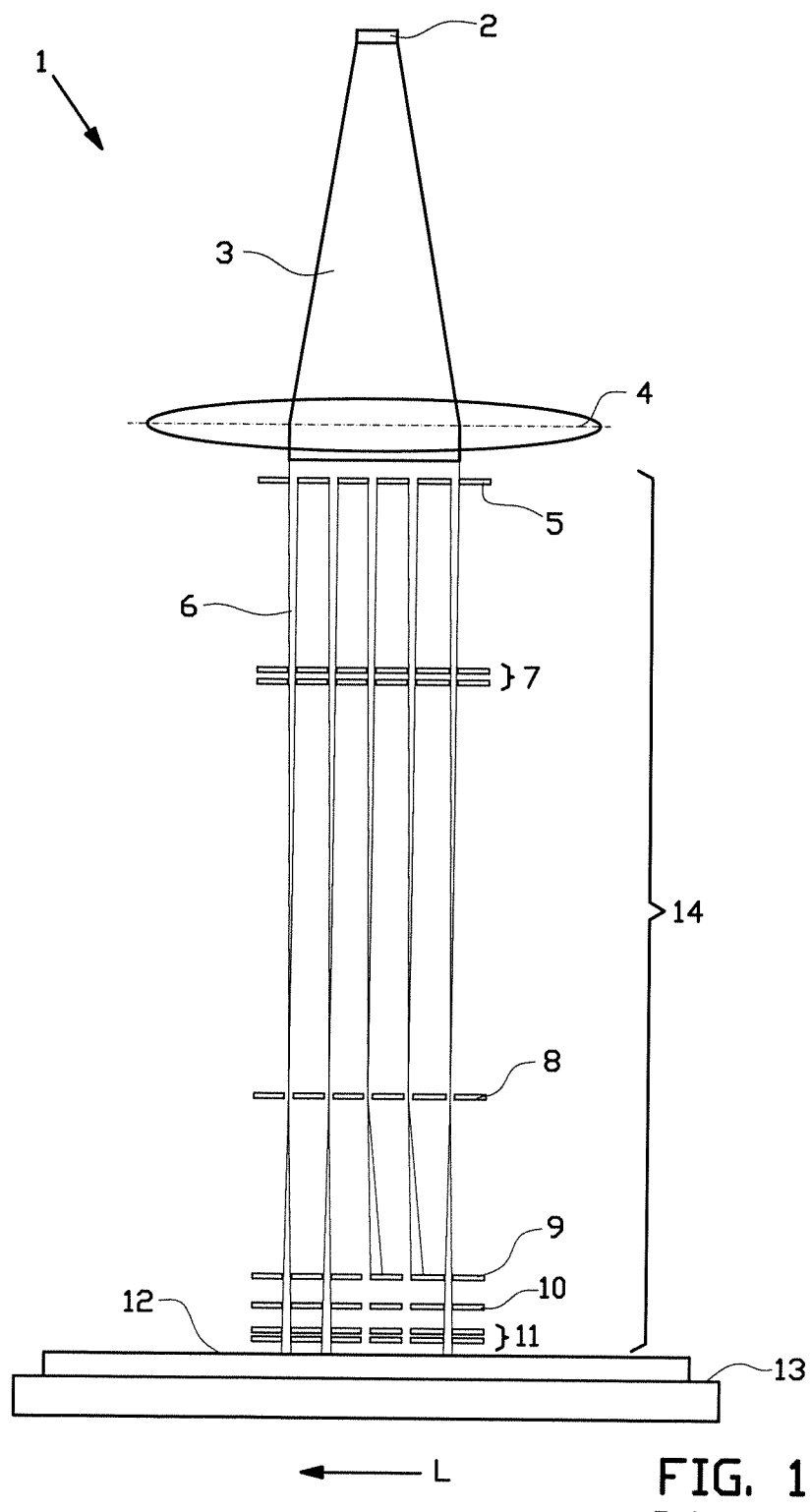
FIG. 1 shows a prior art lithography system in which the substrate according to the invention may be used.

A known lithography system is shown in FIG. 1. The lithography system 1 comprises a charged particle beam source 2 which emits a charged particle beam 3. Charged particle beam 3 traverses a collimator 4 before impinging on an aperture array 5. The aperture array splits the beam into a multitude of charged particle beamlets 6 which are condensed by condenser array 7. At beam blanker array 8 individual beamlets may be blanked, i.e. may be individually deflected such that they encounter beam stop array 9 later on in their trajectories instead of passing through apertures in beam stop array 9. The beamlets that have not been blanked then pass through a scanning deflector 10 which is adapted to provide a scanning deflection of said beamlets. At the end of their trajectories the beamlets that have not been blanked pass through a focusing lens array 11 adapted for focusing said beamlets onto a surface of a target 12, for instance a wafer. The target is placed on a moveable target carrier 13, adapted for displacing the target relative to optical column 14 along a long-stroke direction L, using a long-stroke actuator. The target carrier is further adapted for displacing the target along a short-stroke direction S by means of a short-stroke actuator. The short-stroke actuator may further comprise a 6 degree of freedom actuator, for fine tuning translation of the target in three orthogonal directions, and for fine tuning rotation of the target along three orthogonal axes. Typically a target 12 is exposed in a strip-by-strip fashion by moving the target under the optical column 14 using the long stroke actuator while exposing the target 12 to beamlets that may be deflected along the width of a strip along the short-stroke direction by the scanning deflector 10. When an entire strip has thus been patterned, the short stroke actuator may be used to displace target a distance corresponding to the width of the strip in the S direction, and the next strip may be processed.

When structures span more than one strip, or when a strip of the target is to be processed in multiple passes, for instance when patterning different layers of a semiconductor device, it is essential that the overlain layers can be aligned to within a specified accuracy. Such alignment may be achieved by accurately positioning the target 12 relative to the optical column 14.

Figure 2:
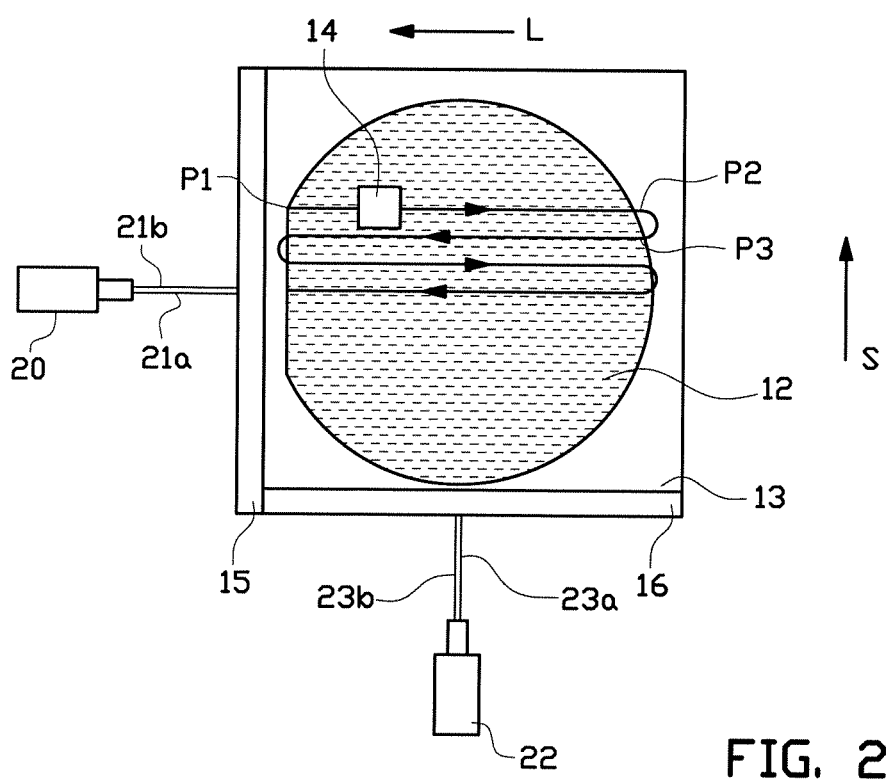
FIG. 2 shows a prior art positioning system, for determining a position of a target relative to an optical column.

FIG. 2 shows a schematic top view of a prior art position measurement system for use in a lithography system, in which the position of the optical column 14 is measured relative to a target carrier 13 carrying a target 12. The target 12 is partitioned into strips along the long-stroke direction L. Patterning of the target may commence when point p1 of the target is placed under the optical column 14 of a lithography system. Because of the scanning deflection of the beamlets, any part of the strip can be reached by the beamlets when the target 12 is moved under the optical column 14 by the long-stroke actuator of the lithography system. When point P2 of the target 12 is under the optical column 14, the short-stroke actuator may be used to move the target in a direction perpendicular to the long-stroke direction L, such that point P3 of the target is placed directly underneath the optical column 14, and the next strip may be processed. Target carrier 13 is provided with straight edges 15,16, or mirrors, wherein edge 15 is perpendicular to the long-stroke direction L, and edge 16 is perpendicular to short-stroke direction S. The edges 15,16 are adapted reflecting one or more beams 21a,21b, 23a,23b respectively from interferometers 20,22 for keeping track of a change in distance between said interferometer and edge 15 and 16 respectively of the target carrier 13. Based on any changes in these distances a position of the target 12 relative to the optical column 15 is calculated, i.e. the position is obtained indirectly as a function of change in the distance along the long- or short-stroke directions. Any changes in said distance will lead to a change in the calculated position, even if the changes in distance are not caused by a long-stroke or short-stroke actuator of the system. For instance, when the edge 15 deforms, changing the tilt of the edge and/or changing the focus of interferometer beam 21a incident on the edge 15, the calculated position of the target 12 relative to the optical column 14 will change. Moreover, any changes in the position or orientation of the interferometer 20 will affect the calculated position as well.

FIG. 3A shows an embodiment of a substrate 45 according to the invention. The substrate 45 comprises an at least partially reflective surface 40 adapted for at least partially reflecting a beam, such as a beam having a Gaussian beam profile. In the embodiment shown the surface comprises siliconoxide or silicondioxide, preferably coated with a reflective metal, and is provided with beam absorbing structures 41a,41b,42a,42b,43a,43b, and 44a,44b, which are adapted for at least partially absorbing a beam having a wavelength λ, for example 640 nm. The structures 41a,41b,42a,42b,43a, 43b, and 44a,44b together with the surface 40 form a position mark extending along its longitudinal direction L. Preferably the substrate is arranged in a lithography system, for instance a system as shown in FIG. 1, with its longitudinal direction L along the long-stroke direction of the lithography system. The substantially rectangular structures 41a,41b, 42a,42b, 43a, 43b, and 44a,44b are spaced apart and arranged to vary a reflection intensity of the beam dependent on the position of beam spot 50 of the beam on the surface. The distance between any two structures is less than the wavelength λ, and less than or equal to the width w of the beam spot which is defined as the maximum dimension of the beam spot along direction L. Thus, at any time the beam spot is within the pattern, it is located either directly adjacent to or incident on one or more of the structures. The pattern of the structures repeats over a period d which period is greater than the width w of the beam spot 50. In this embodiment the distance between neighboring structures is related to the amount of light the structures can absorb when the alignment beam is incident thereon. The structures having larger areas 41a,41b and 42a,42b are arranged closer to each other than structures 43a,43b and 44a,44b which have smaller areas with which to absorb the beam. Moreover the pitch between two structures, e.g. the distance from a leftmost side of a first structure to a leftmost side of a second, neighboring structure, varies dependent on the areas of the structures.

FIG. 3B shows a reflected beam intensity graph for the substrate of FIG. 3A. The intensity I of the reflected beam is highest when no part of the beam 50 spot is incident on a structure, as at point 61 along the longitudinal axis, and lowest when the beam spot is at point 62 along the longitudinal axis L, at which point a substantial part of the beam is absorbed by the structures 41a,41b, and 42a,42b. When the position mark is illuminated by a beam with a substantially constant intensity and the beam spot travels along direction L, the intensity of the reflected beam follows a sinusoid function as shown, even when the beam spot has a Gaussian profile. The reflected signal thus provides a reference for a position of the beam spot within a period of the pattern.

Information on the position of the beam spot on the substrate is encoded at the substrate in the form of the intensity of the reflected light beam. Small deformations of the surface or changes in distance between the alignment beam source and the surface do not substantially change the intensity of the reflected beam and therefore do not substantially affect the position measurement. Moreover, requirements on the position and focus and/or position stability of the beam source can be relatively lax as small changes in focus depth or angle of incidence do not substantially influence the shape of the resulting intensity graph.

FIGS. 4A, 4B and 4C show embodiments of a substrate according to the invention. FIG. 4A shows structures 71a, 71b,72a,72b,73a,73b,74a,74b,75a, and 75b of a same width b, etched on a partially reflective surface 70 of a substrate 90 comprising polished siliconoxide. The width b of the structures is smaller than the wavelength of a beam which is to illuminate the substrate 90 for positioning purposes. The structures 71a,71b,72a,72b,73a,73b,74a,74b,75a, and 75b repeat over a period a, which is larger than the diameter w1 of the spot 95 of the beam on the substrate 90. When the beam has a Gaussian beam profile, the diameter of the beam is determined w1 in a manner known in the art, for instance by determining the full width of the beam at half its maximum intensity. A distance c between two leftmost edges of neighboring structures varies along the longitudinal direction L of the substrate 90, such that the intensity of the beam reflected by the substrate varies along the longitudinal direction L. The maximum distance between two neighboring structures is equal to the diameter w1 of the beam spot 95. In an embodiment this maximum distance may be less than the diameter w1 as well.

FIG. 4B shows a substrate 91 according to the invention in which the leftmost edges of structures 76a, 77a, 78a, 79a are aligned on a virtual grid of points which are arranged equidistantly at a distance c from each other along the longitudinal direction. The structures form a periodic pattern having a period a, and each have a width. The width of the structures varies sinusoidally along the longitudinal direction L. Within a period of the pattern, a distance between two leftmost edges of two neighboring structures 77a, 78a is different from a distance between two leftmost edges of two other neighboring structures 79a, 79b, i.e. the distance is c and 3 times c respectively. Thus, when the beam spot 96 having a diameter w2 greater than c is incident on the substrate but not on structures of the substrate, as shown, the reflected beam will have a maximum reflected intensity. The substrate according to this embodiment is especially easily manufactured, as the structures are aligned on a regular grid.

In FIG. 4C the distance from leftmost edge to leftmost edge between neighboring structures varies along the longitudinal direction L of substrate 92, and the width b of the structures 80a,80b,81a,81b,82a,82b,83a,83b themselves varies along the longitudinal direction L as well. No two neighboring structures are spaced apart more than the diameter w3 of the beam spot 97.

FIG. 4D shows an embodiment of a substrate 93 according to the present invention, comprising a partially reflective surface 70, on which structures 84a,84b,85a,85b,86a,86b,87a, 87b and 88a,88b are provided in a periodic array having period a. Within a period pairs of structures 84a,84b, 88a,88b of a same material are provided. The structures 84a, 85a, 86a, 87a and 88a all comprise different materials having different reflection coefficients. The pitch c between the structures is equal along the longitudinal direction, and the structures have a substantially equal width along the longitudinal direction as well. The intensity of the reflected beam depends on the position of the beam spot 98 on the substrate.

Figure 5:
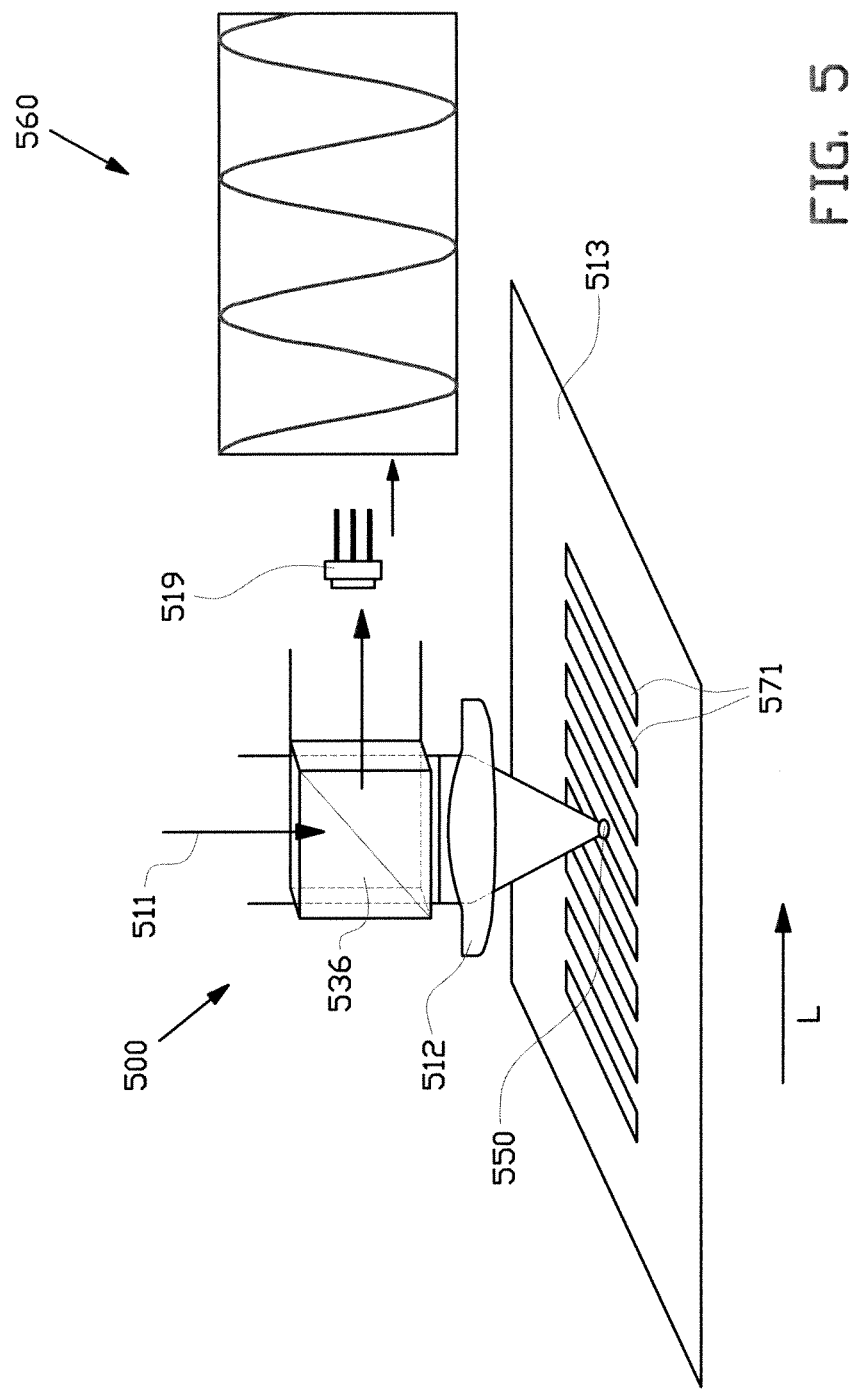

FIG. 5 schematically shows a position device 500 according to the invention, for detecting an alignment and/position of a beam spot 550 on a substrate 513 according to the invention. The substrate comprises a partially reflective surface, said surface having a substantially constant reflection coefficient, and provided with beam absorbing structures 571, which vary a specular reflection coefficient of the substrate along the longitudinal direction L. A light beam 511 of a predetermined wavelength is passes through beam splitter 536 and is focused by lens 512 onto a spot on the substrate 513, and partially reflected therein. The intensity of the reflected beam is detected by beam intensity detector 519. Graph 560 shows a plot of the detected beam intensity vs. position of the spot on the substrate, when the substrate is moved along the longitudinal, or long-stroke, direction L. The position device is adapted for alignment of a beam spot on a substrate according to the invention, for instance by moving the substrate along the direction L relative to the position device, until a specific peak in detected light intensity has been reached. Using a target comprising a substrate according the invention it is thus possible to reproducibly and accurately move the substrate to a predetermined position with respect to the alignment beam. This is particularly useful when several layers of patterns are overlain during separate processing sessions of a same target. Once the target has been aligned the position may be tracked using other position measuring means known in the art, such as interferometers.

Alternatively, the position device may be used to track a position of the beam on the substrate during processing of the target, e.g. during preparation and/or exposure of a target in a lithography system, based on the number of peaks encountered in the detected intensity signal. Based on the number of peaks encountered and the actual detected intensity value, an even more accurate position can be determined.

Figure 6A:
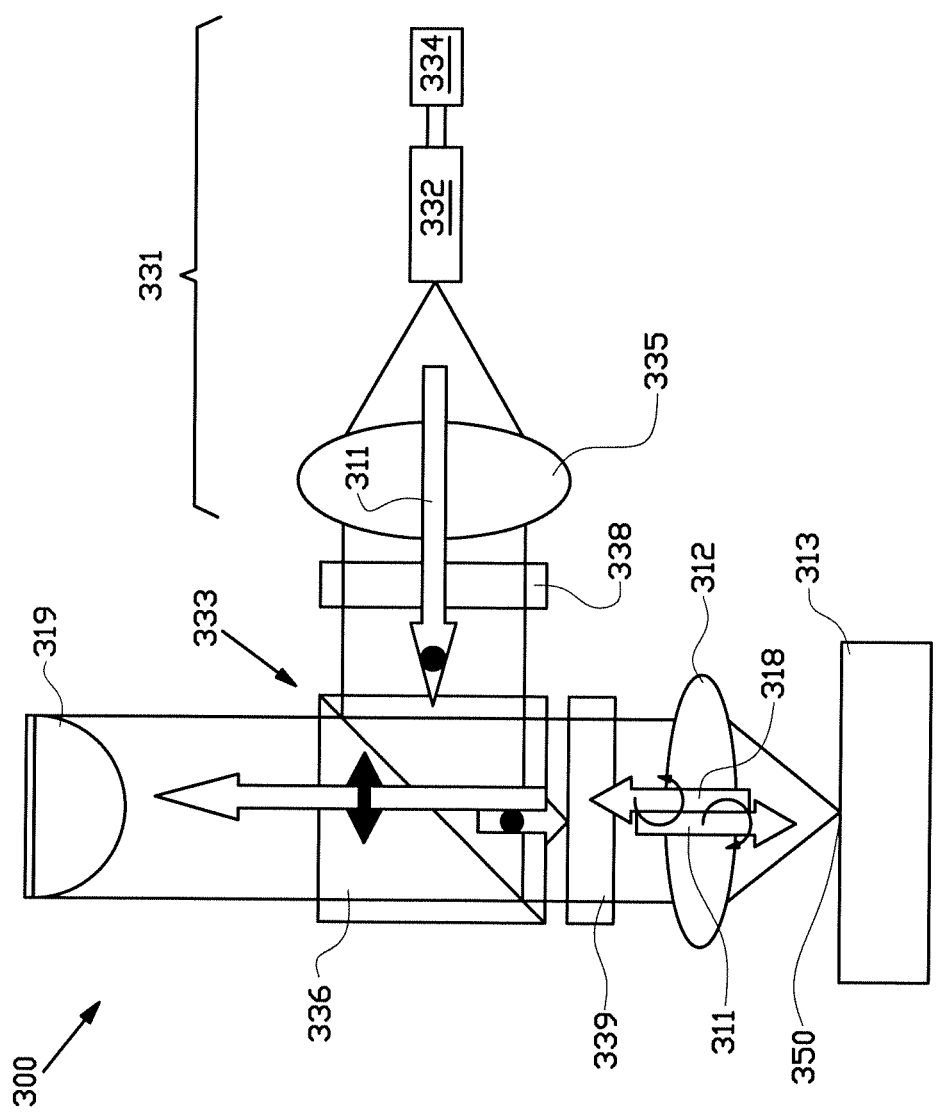
FIG. 6A shows a schematic detail of a position device according to the present invention, FIG. 6B schematically shows a lithography system in which the optical system shown in FIG. 6A is attached to the optical column.

FIG. 6A schematically shows a position device 300 according to the invention in more detail. The position device is adapted for detecting the position of a beam spot 350 on a substrate 313 according to the invention. Beam source 331 comprises a laser 334 for providing a beam 311 with a wavelength in the range of 600-650 nm, or about 635 nm. The beam source 331 further comprises an optical fiber 332 for guiding the light beam 311 from the laser 334 towards the optical system 333. The beam leaving the optical fiber 332 preferably has a nearly perfect Gaussian profile and may be easily collimated. The beam source comprises a collimator lens 335 arranged for collimating the beam 311 from optical fiber 332.

However, when a fiber is not used and the laser or another beam generating device is providing a collimated beam, such a collimating lens 335 may not be required.

The optical system 333 further comprises a beam splitter 336, for directing the beam 311 towards surface of the substrate 313. A focusing lens 312 of the optical system focuses beam 311 on the surface 313. The reflected beam 318 is generated by specular reflection of the beam 311 in the substrate 313. The focus lens 12 may also be used for collimating the reflected beam 318. The reflected beam 318 is directed towards the beam intensity detector 319 by beam splitter 336.

The beam intensity detector 319 comprises a photodiode. Alternatively is may comprise an un-biased silicon PIN diode working in the photovoltaic mode. This mode may lower the amount of heat generated with respect to a biased mode operation of a photodiode. The beam intensity detector may also comprise an operational amplifier to convert the current from the photodiode into a voltage which may be filtered. The filtered voltage may be converted to a digital signal that may be used by a processor for determining a position or displacement of the surface 313 relative to the optical system 333.

The active area of the beam intensity detector 319 is larger than the diameter of the reflected light beam leaving the beam splitter so that substantially all of the energy leaving the beam splitter is detected. However, another focus lens (not shown) located between the beam splitter 336 and the beam intensity detector 319 may be used for focusing the reflected light beam on the beam intensity detector 319. In this way the effective area of the beam intensity detector may be smaller than the diameter of the reflected light beam leaving the beam splitter 336.

In a non-polarizing beam splitter 336 it may be the case that 50% of the light beam 311 is directed towards the substrate 313, while the other 50% may be lost. And of the reflected light beam only 50% may be directed to the beam intensity detector 319, while the other 50% may be lost. This implies that 75% of the light beam 311 is lost, i.e. is not used for the position and/or alignment detection.

Therefore, a polarizing beam splitter may be used in an embodiment of the mark position detector device according to the invention. In that case, the beam source 331 may provide a polarized light beam 311. The beam source may comprise a polarizer 338 arranged for transforming a non-polarized light beam into a polarized light beam 311. Light beam 311 may be an S-polarized light beam, which is indicated in the figure by a dot.

The polarizing beam splitter 336 may be arranged for guiding the S-polarized light beam towards the surface of the substrate. The optical system may further comprise a quarter wave plate 339, which may be located between the beam splitter 336 and the focus lens 312. When the light beam 311 travels through the quarter wave plate 339, it its polarization is changed from S-polarization into a right circular polarization, as is indicated by a curved arrow in the figure. When the beam 311 is reflected by the surface 313, polarization may change again: the reflected light beam may have a left circular polarization, as is indicated by another curved arrow in the figure. When the reflected light beam 318 travels through the quarter wave plate 339, its polarization is changed from left circular polarization into a P-polarization which is indicated by a straight arrow in the figure. Polarizing beam splitter 336 is arranged to guide the P-polarized reflected light beam towards the light intensity detector 319.

The use of a polarized light beam and reflected light beam and a polarizing beam splitter results in a reduction of stray light, back reflection and energy loss in the beam splitter.

Figure 6B:
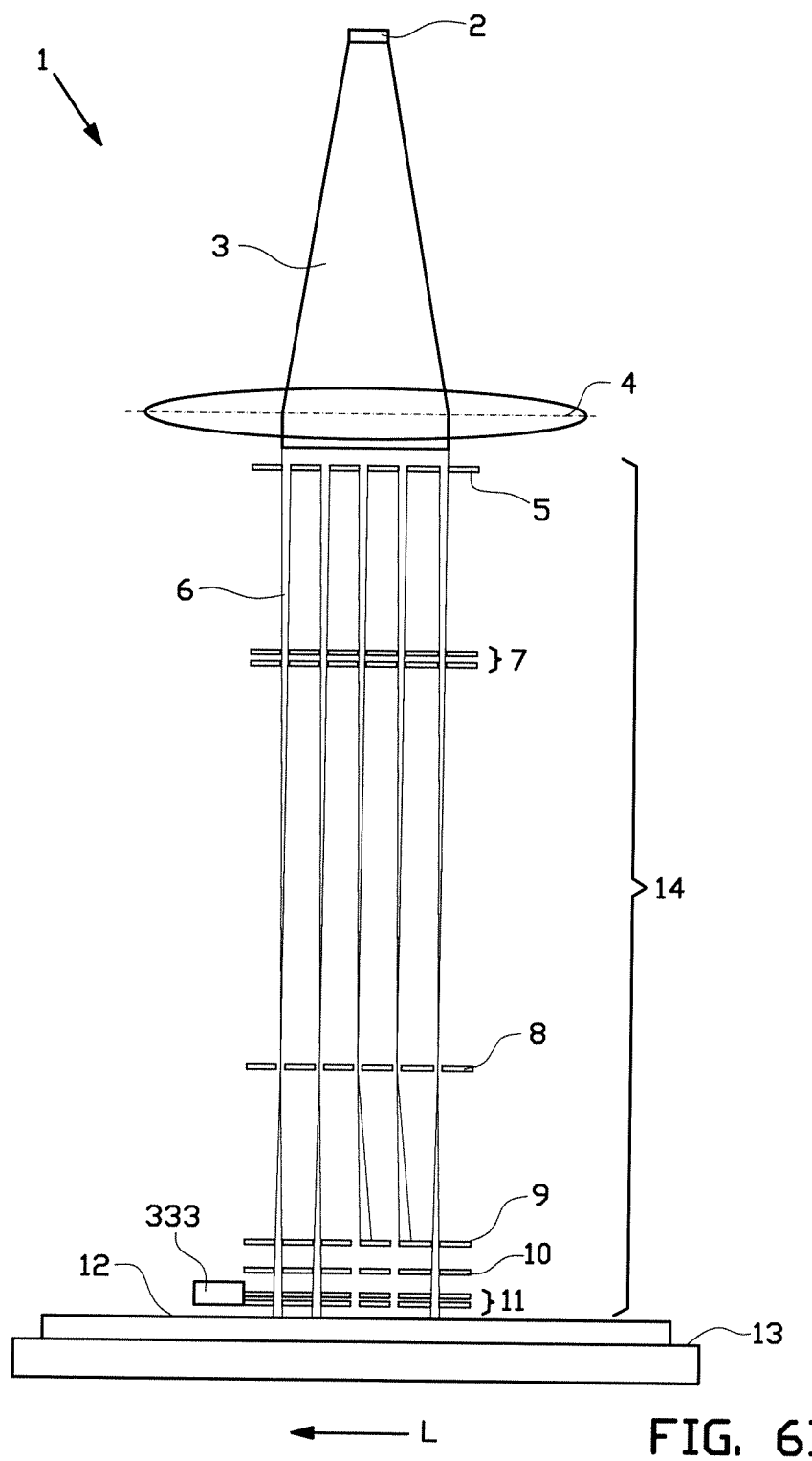

FIG. 6B schematically shows the lithography system of FIG. 1, wherein the optical system 333, which is part of the positioning device 300 shown in FIG. 6A, is attached to the optical column 14. In the embodiment shown, the optical system is mounted near the downstream portion of the optical column 14.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Position device arranged for determining a position of an alignment beam spot on a position mark of a substrate (313; 513), said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength, said position device comprising:
   an alignment beam source (331) arranged for providing a polarized-light alignment beam of said predetermined wavelength;
   a beam intensity detector (319) arranged for determining an intensity of a reflected alignment beam, wherein the reflected alignment beam is generated by reflection of the alignment beam on said position mark;
   an optical system arranged for focusing the alignment beam on the position mark and for guiding the reflected alignment beam on the beam intensity detector, wherein said optical system comprises:
   a polarizing beam splitter (336),
   a focusing lens (312) arranged for focusing the alignment beam on the substrate (313), such that the alignment beam is focused to a spot on the substrate, said spot being smaller than a period of said structures along said longitudinal direction;
   a quarter wave plate (339) located between the beam splitter and the focusing lens (312),
   wherein said beam intensity detector is arranged for detecting a light beam intensity for only the zeroth order reflection of the reflected alignment beam and adapted for providing a signal representative of the reflected alignment beam intensity, said signal representing the position of the beam spot on the position mark as the beam spot is moved over the position mark along the longitudinal direction.

2. Position device according to claim 1, wherein said polarizing beam splitter (336) is arranged for directing said polarized light beam (311; 511) towards said substrate and for directing said reflected alignment beam towards the alignment beam intensity detector (319; 519).

3. Lithography system for processing a target, said system comprising:
   a substrate (313; 513), said substrate being provided with an at least partially reflective position mark comprising an array of structures, the array extending along a longitudinal direction of the mark, wherein said structures are arranged for varying a reflection coefficient of the position mark along the longitudinal direction, wherein said reflection coefficient is determined for a predetermined wavelength;
   an alignment beam source (331) arranged for providing a polarized-light alignment beam (311; 511) of said predetermined wavelength;

a alignment beam intensity detector (319; 519) arranged for determining an intensity of a reflected alignment beam (318), wherein said reflected alignment beam is generated by reflection of the alignment beam on said position mark;

an optical system (333) arranged for focusing the alignment beam on the position mark and for guiding the reflected alignment beam on the alignment beam intensity detector (319; 519), wherein said optical system comprises:

a polarizing beam splitter (336), a focusing lens (312) arranged for focusing the alignment beam on the substrate (313) such that the alignment beam is focused to a spot on the substrate, said spot being smaller than a period of said structures along said longitudinal direction, a quarter wave plate (339) located between the beam splitter and the focusing lens (312), wherein said alignment beam intensity detector (319; 519) is arranged for detecting an alignment beam intensity of only the zeroth order reflection of the reflected alignment beam, wherein only said zeroth order reflection of said alignment beam is guided onto the alignment beam intensity detector, and a processing unit adapted for determining an alignment and/or position of the substrate relative to the optical system based on the detected intensity of the reflected alignment beam as the beam spot is moved over the position mark along the longitudinal direction.

4. Lithography system according to claim 3, further comprising:

a target carrier (13), adapted for moving the target (12) relative to the optical system along the longitudinal direction, wherein said substrate is provided on the target carrier and/or on the target.

5. Lithography system according to claim 4, further comprising:

an optical column (14) adapted for projecting one or more exposure beams on the target, wherein the optical system is attached to the optical column (14).

6. Lithography system according to claim 5, wherein the optical column (14) is adapted for projecting a multitude of charged particle exposure beams onto the target, and wherein said optical system (333) is mounted on or near a downstream portion of the optical column (14), within a distance of 100 micron to an outer exposure beam thereof.

7. Lithography system according to claim 3, wherein, at least during use the optical system is arranged at a distance of 2 mm or less from the substrate.

8. Lithography system according to claim 3, wherein the optical system (14) is arranged for projecting said alignment beam onto the substrate substantially perpendicular on said substrate.

9. Lithography system according to claim 3, wherein said polarizing beam splitter (336) is arranged for directing said polarized alignment beam (311; 511) towards said substrate and for directing said reflected alignment beam towards the alignment beam intensity detector (319; 519).

10. Lithography system according to claim 3, wherein said alignment beam source comprises a polarizer (338) arranged for transforming a non-polarized light beam into said polarized-light alignment beam (311).

11. Lithography system according to claim 10, wherein said polarized-light alignment beam (311) provided by said alignment beam source is an S-polarized light beam, wherein, when the alignment beam (311) travels through the quarter wave plate (339) its polarization is changed from S-polarization into a right circular polarization, and wherein when the right circular polarized alignment beam is reflected by a surface of the substrate, the reflected alignment beam has a left circular polarization.

12. Lithography system according to claim 11, wherein the polarization of said left circular polarized reflected alignment beam (318) is changed into a P-polarization when the reflected alignment beam travels through the quarter wave plate, and wherein the polarized beam splitter is arranged for directing the S-polarized light beam towards said substrate and for directing the P-polarized reflected alignment beam towards said alignment beam intensity detector.

13. Method for determining an alignment and/or position of an alignment beam spot on a position mark of a substrate (313; 513) in a lithography system, said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength, said method comprising:

using an alignment beam source (331) of said lithography system, providing a polarized-light alignment beam of said predetermined wavelength;

using an optical system of said lithography system, focusing the alignment beam on the position mark and guiding a reflected alignment beam, that is generated by reflection of the alignment beam on said position mark, on a beam intensity detector, wherein said optical system comprises:

a polarizing beam splitter (336) arranged for directing said alignment beam (311) towards a surface of said substrate (313; 513) and for directing said reflected alignment beam towards the beam intensity detector (319; 519);

a focusing lens (312) arranged for focusing the alignment beam on the substrate (313) such that the alignment beam is focused to a spot on the substrate, said spot being smaller than a period of said structures along said longitudinal direction;

a quarter wave plate (339) located between the beam splitter and the focusing lens (312);

said method further comprising:

using the beam intensity detector (319), determining an intensity of only a zeroth order reflection of the reflected alignment beam; and determining said alignment and/or position of the substrate relative to the optical system based on the detected intensity of the reflected alignment beam measured as the beam spot is moved over the position mark along the longitudinal direction.

14. Method according to claim 13, wherein said lithography system comprises a target carrier (13) for moving a target (12) relative to the optical system along said longitudinal direction of the substrate, wherein said substrate is provided on the target carrier or on the target.

15. Method according to claim 13, further comprising a step of measuring a position of the substrate using a further measurement system, wherein an alignment of the substrate in the lithography system is further determined based on the measurement by the further measurement system.

16. Method according to claim 15, wherein alignment of the beam spot of said alignment beam on said substrate is initially performed based on the measured intensity of the beam reflected by the substrate, after which further determination of the position of the substrate during processing of a target in said lithography system is based on the measurements by the further measurement system.

* * * * *